United States Patent [19]
Calvert et al.

[11] Patent Number: 5,976,284
[45] Date of Patent: Nov. 2, 1999

[54] PATTERNED CONDUCTING POLYMER SURFACES AND PROCESS FOR PREPARING THE SAME AND DEVICES CONTAINING THE SAME

[75] Inventors: Jeffrey M. Calvert, Alexandria; Terrence G. Vargo, Fairfax Station; Ranganathan Shashidhar, Springfield, all of Va.; Mu-San Chen, Ellicott City, Md.

[73] Assignees: The United States of America as represented by the Secretary of the Navy, Washington, D.C.; Geo-Centers, Inc., Newton Centre, Mass.

[21] Appl. No.: 08/855,018

[22] Filed: May 12, 1997

Related U.S. Application Data

[62] Division of application No. 08/562,099, Nov. 22, 1995, abandoned.

[51] Int. Cl.⁶ ..................................................... H01B 7/02
[52] U.S. Cl. ................... 156/51; 156/53; 156/56; 427/108; 427/261; 427/302; 427/181; 430/311; 430/325; 430/296; 205/125; 205/159; 252/81; 252/422; 252/518
[58] Field of Search ..................................... 430/311, 313, 430/315, 317, 318, 330; 252/81, 422, 518; 427/84, 267, 302, 255.6, 322, 108; 205/125, 159; 156/51, 53, 56

[56] References Cited

U.S. PATENT DOCUMENTS

| | | | |
|---|---|---|---|
| 4,699,804 | 10/1987 | Miyata et al. | 437/176 |
| 4,710,401 | 12/1987 | Warren, Jr. | 427/255.6 |
| 4,898,766 | 2/1990 | Tamamura et al. | 428/195 |
| 4,945,257 | 7/1990 | Marrocco, III | 307/201 |
| 4,946,903 | 8/1990 | Gardella, Jr. et al. . | |
| 5,147,968 | 9/1992 | Epstein et al. | 528/210 |
| 5,219,490 | 6/1993 | Basu et al. | 252/171 |
| 5,219,492 | 6/1993 | Osterholm et al. | 252/500 |
| 5,232,631 | 8/1993 | Cao et al. | 252/500 |
| 5,252,695 | 10/1993 | Niciri et al. . | |
| 5,266,309 | 11/1993 | Gardella, Jr. et al. . | |
| 5,293,261 | 3/1994 | Shashidhar et al. . | |
| 5,342,737 | 8/1994 | Georger, Jr. et al. . | |
| 5,391,463 | 2/1995 | Ligler et al. . | |
| 5,422,194 | 6/1995 | Satoh et al. | 428/704 |
| 5,447,824 | 9/1995 | Mutsaers et al. | 430/315 |
| 5,545,308 | 8/1996 | Murphy et al. | 205/125 |
| 5,561,030 | 10/1996 | Holdcroft et al. | 430/311 |
| 5,578,351 | 11/1996 | Shashidhar et al. . | |
| 5,696,207 | 12/1997 | Vargo et al. . | |
| 5,828,432 | 10/1998 | Shashidhar et al. . | |

OTHER PUBLICATIONS

R. V. Gregory et al, *Synthetic Metals*, vol. 28, pp. C–823–C835 (1989).

(List continued on next page.)

*Primary Examiner*—Merrick Dixon
*Attorney, Agent, or Firm*—Oblon, Spivak, McClelland, Maier & Neustadt, P.C.

[57] ABSTRACT

Patterned conducting polymer surfaces exhibiting excellent properties may be prepared by:

(a) forming a surface of a conducting polymer on a surface of a substrate;

(b) forming a surface of a blocking material on said surface of said conducting polymer in a pattern-wise fashion, to obtain a first patterned surface containing regions of exposed conducting polymer and regions of blocking material;

(c) treating said first patterned surface with an agent which: (i) removes said conducting polymer from said regions of exposed conducting polymer; (ii) decreases the conductivity of said conducting polymer in said regions of exposed conducting polymer; or (iii) increases the conductivity of said conducting polymer in said regions of exposed conducting polymer; and (d) removing said blocking material to obtain a second patterned surface containing an exposed pattern of conducting polymer.

23 Claims, 5 Drawing Sheets

POLYMER DISPERSED LIQUID CRYSTAL DISPLAY
ON CONDUCTING POLYMER SUBSTRATES

A: SUBSTRATE: PET, FEP, OR GLASS
B: CONDUCTING POLYMER

OTHER PUBLICATIONS

C. B. Gorman et al, *Chemistry of Materials*, vol. 7, pp. 526–529 (1995).

M. Hikita et al, *Japan Journal of Applied Physics*, vol. 24, pp. L79–L81 (1985).

M. Okana et al, *Journal of the Electrochemical Society*, vol. 134, pp. 837–841 (1987).

M. C. Dos Santos et al, *Phys. Rev. Lett.*, vol. 62, pp. 2499–2502 (1989).

M. C. Dos Santos, *Synth. Metals*, vol. 29, pp. E321–E327 (1989).

J. H. Cheung et al, *Thin Solid Films*, vol. 244, pp. 985–988 (1994).

G. B. Street et al, *Molecular Crystals and Liquid Crystals*, vol. 83, pp. 253–264 (1982).

J. Lei et al, *Synthetic Metals*, vol. 48, pp. 301–312 (1992).

C. Kakouris et al, *Synthetic Metals*, vol. 48, pp. 65–77 (1992).

P. A. Christensen et al, *Electrochimica Acta*, vol. 36, pp. 1263–1286 (1991).

J. M. Calvert, in *Polymers for Microelectronics, Resists and Dielectrics*, L.F. Thompson et al, Eds. ACS Symposium Series, No. 537, ACS Press, Washington DC, pp. 210–219, 1994.

L. S. van Dyke et al, *Synthetic Metals*, vol. 52, pp. 299–304 (1992).

R. Baumann et al, *Synthetic Metals*, vol. 54, pp. 243–249 (1993).

K. G. Neoh et al, *Synthetic Metals*, vol. 73, pp. 209–215 (1995).

M. F. Combarel et al, *C. R. Acad. Sci. Ser. C.*, vol. 262, pp. 459–462 (1966).

M. Doriomedoff et al, *J. Chim. Phys.* (Paris), vol. 68, pp. 1055–1069 (1971).

T. Ito et al, *J. Polym. Sci. Chem. Ed.*, vol. 12, pp. 11–20 (1974).

H. Shirakawa et al, *J.C.S. Chem. Commun.*, pp. 578–579 (1977).

C. K. Chiang et al, *Phys. Rev. Lett.*, vol. 39, pp. 1098–1101 (1977).

P. J. Nigrey et al, *J.C.S. Chem. Commun.*, pp. 594–595 (1979).

A. G. MacDiarmid et al, *Synth. Metals*, vol. 1, pp. 101–118 (1980).

D. M. Ivory et al, *J. Chem. Phys.*, vol. 71, pp. 1506–1507 (1979).

A. F. Diaz et al, *J.C.S. Chem. Commun.*, pp. 635–636 (1979).

K. K. Kanazawa et al, *J.C.S. Chem. Commun.*, pp. 854–855 (1979).

K. F. Schoch et al, *Synthetic Metals*, vol. 72, pp. 13–23 (1995).

E. M. Genies et al, *Synth. Metals*, vol. 36, pp. 139–177 (1990).

H. W. Gibson et al, *J. Am. Chem. Soc.*, vol. 105, pp. 4417–4431 (1983).

CONDUCTING POLYMER TWISTED NEMATIC CELLS
- A: POLARIZER/ANALYZER
- B: SUBSTRATE: PET, FEP, GLASS
- C: CONDUCTING POLYMER: PPY, PANI
- D: ALIGNMENT LAYER: RUBBED PPY OR PANI
  RUBBED POLYIMIDE,
  NON-RUBBED ALIGNMENT LAYER

CONVENTIONAL TWISTED NEMATIC CELLS:
- A: POLARIZER/ANALYZER
- B: SUBSTRATE: GLASS
- C: CONDUCTING COATING: ITO
- D: ALIGNMENT LAYER: RUBBED POLYIMIDE

PATTERNED CONDUCTING POLYMER SURFACES AND PROCESS FOR PREPARING THE SAME AND DEVICES CONTAINING THE SAME

This application is a division of application Ser. No. 08/562,099, filed on Nov. 22, 1995 now abandoned.

BACKGROUND OF THE INVENTION

1. Field of the Invention

The present invention relates to a simple, convenient process for preparing high-resolution patterns of a conducting polymer on a substrate. The present invention also relates to the patterned conducting polymer surfaces so prepared and to devices, such as liquid crystal displays, which contain such a patterned conducting polymer surface. The patterned conducting polymer, e.g. polypyrrole, may serve as a conducting material to provide a means of addressing selected pixels of a lightweight, flexible liquid crystal display.

2. Discussion of the Background

In current liquid crystal (LC) display fabrication technology, the most widely used conductive material is indium tin oxide (ITO). However, the use of ITO has several disadvantages in manufacturing. One drawback is the relatively high temperature (about 250° C.) at which ITO is deposited onto glass or other solid substrates, which can damage other components of the display such as polymeric color filters. Another problem is that when ITO is deposited on plastic substrates for purposes such as fabrication of flexible LC displays, the ITO becomes brittle and fails when the display is in a curved configuration for extended times. Thus, there is a need for a pliable conducting material to replace ITO for long-term operation of flexible and/or large area LC display devices.

An electrically conducting polymer is a desirable alternative to ITO as the conducting material, because it can be processed at ambient temperature and it is a flexible organic material similar to the plastic substrate. A general reference on the subject of conducting polymers is the monograph *Organic Conductors*, J. P. Farges, Ed., Marcel Dekker, NY, N.Y., 1994. The concept of using a conducting polymer as a replacement for ITO in a LC display is described in U.S. patent application Ser. No. 08/401,912, filed on Mar. 9, 1995.

The conducting polymer polypyrrole (PPy) is an excellent choice as a replacement conducting material for ITO, because PPy can be prepared by a convenient, in-situ polymerization method, and PPy films can be produced with surface resistance, electrical conductivity, and optical transparency characteristics that are appropriate for LC displays and other applications. The in situ method can be used to deposit thin, transparent films of electrically conducting polymers such as polyaniline and polypyrrole from aqueous solutions of the parent monomers, aniline and pyrrole, as they are undergoing polymerization. This method eliminates the necessity of first synthesizing the polymer and then dissolving it in a solvent for film deposition and is the simplest and least time-consuming approach for preparation of conducting polymer films. The use of aqueous solutions for the in-situ polymerization method also alleviates environmentally-related organic solvent disposal problems. Both of these factors are important for technological scale-up and commercialization of processes using conducting polymers.

PPy films deposited by the in-situ method can be prepared with conductivities >300 S/cm using the anthraquinone-2-sulfonate counterion in the presence of 5-sulfosalicylic acid (see for example: R. V. Gregory, W. C. Kimbrell, and H. H. Kuhn, *Synthetic Metals*, vol. 28, p. C-823 (1989)). This translates to a surface resistance of between 600–3000 Ω/square, nearly two orders of magnitude lower than that for typical polyaniline films deposited by the in situ method. These PPy films can also be obtained with optical transparencies in the range of >65%–70% transparent. In-situ-deposited PPy films therefore have properties that make them very useful as conductive elements for the fabrication of a variety of liquid crystal display devices.

To fabricate an addressable LC display, one of the conducting elements must be patterned to a particular geometry and linewidths that constitute the designated output of the display. Depending on the nature of the LC display, the geometry may be in an alphanumeric pattern, a grid pattern, an array of dots, or some other pattern. The minimum dimension of the patterned features typically ranges from relatively large (>100 μm) to very fine (~10 μm). A process for patterning conducting polymers must be able to meet the resolution requirements of the display. Additionally, the process for patterning the conductive polymer must not adversely affect the electrical surface resistance or the optical transparency of the conducting polymer in the active regions, or the properties of the underlying substrate. Finally, the patterning process must be simple, reproducible, cost-effective, and compatible with existing manufacturing equipment used in the LC display industry.

A number of methods have been reported for producing patterns of PPy on various substrates. In one method, long-chain alkyl self-assembled monolayer (SAM) films are stamped onto a gold substrate. The SAM-modified electrode is immersed in a solution of pyrrole, and the SAM film blocks electron transfer so that PPy is deposited only in the bare regions of the substrate. For a detailed description of this approach, see: C. B. Gorman, H. A. Biebuyck, and G. M. Whitesides, *Chemistry of Materials*, vol. 7, pp. 526–529 (1995). In related approaches, the patterned deposition of PPy can be initiated at semiconducting substrates by patternwise exposure of the substrate through a solution containing pyrrole monomer. The polymerization and deposition of PPy is then initiated photoelectrochemically at the substrate in the irradiated regions of the substrate. For a description of these approaches, see: M. Hikita, O. Niwa, A. Sugita, and T. Yamamura, *Japan Journal of Applied Physics* vol. 24, pp. L79 (1985); and M. Okano, I. Itoh, A. Fujishima, and K. Honda, *Journal of the Electrochemical Society*, vol. 134, p. 837 (1987). These methods are limited to metallic substrates such as gold or semiconducting substrates such as silicon, and are not appropriate for use on flexible, insulating polymeric substrates.

In a second method, a fluoropolymer substrate is modified by a plasma treatment to create regions of greater or lesser adhesion for a PPy film formed from an in-situ deposition method. The plasma is prevented from accessing the substrate in certain regions by the use of a physical mask such as a metal grid. The PPy is deposited initially over the entire substrate, but is then removed from the unmodified regions by either ultrasonication in solution or by removal with adhesive tape. For a description of these approaches, see: U.S. patent application Ser. No. 08/401,912 (see above) and L. S. van Dyke, C. J. Brumlik, W. Liang, J. Lei, C. R. Martin, Z. Yu, L. Li, and G. J. Collins, *Synthetic Metals*, vol. 62, pp. 75–81 (1994). These methods are limited to relatively low resolution PPy pattern formation, characterized by rough edges, and the use of physical masks is not compatible with standard manufacturing techniques for preparing commercially useful addressable liquid crystal displays.

In a third method, a PPy film deposited on a fluoropolymeric substrate was removed from selected regions of the substrate by laser ablation. For a description of this approach, see: L. S. van Dyke, C. J. Brumlik, C. R. Martin, Z. Yu, and G. J. Collins, *Synthetic Metals*, vol. 52, pp. 299–304 (1992). This approach is not preferred for practical applications due to the need for expensive, high-power laser exposure tools which are not desirable for cost-effective manufacturing, as well as the damage caused by laser ablation to the underlying substrate and the edges of the patterns.

In a fourth method, pyrrole vapor is absorbed into a film of a chlorine-containing polymer such as polychloroacrylonitrile (PCAN), and the polymer is then irradiated in a patternwise fashion. In the photolyzed regions, free radicals are created from dissociation of the chlorinated polymer, and the radicals initiate polymerization of the absorbed pyrrole monomer to form a PPy/PCAN composite. For details of this method, see: R. Baumann, K. Lennarz, and J. Bargon, *Synthetic Metals*, vol. 54, pp. 243–249, (1993). No electrical conductivity data for the polymerized pyrrole composite was reported. However, because this material is a mixture of PPy and an insulating material, the conductivity of the composite is almost certainly much lower than that of pure PPy which is a severe disadvantage for use of the composite as a conductive material for display fabrication. In addition, this process is limited to those chlorinated polymers that produce sufficient free radicals to initiate the polymerization of pyrrole. Of the four polymers tested, only PCAN required as little as 5 minutes of exposure with a high intensity (1000 W) lamp. Also, the reported times for sorption of pyrrole into the chlorinated polymer were ~5–10 hours, which is impractical for use of this process in routine manufacturing.

Several methods have been described for patterning polyaniline (PAni). In one method, a film is prepared from a water-soluble derivative of PAni that contains a cross-linkable group on the polymer backbone. The film is exposed to electron-beam or UV irradiation, which crosslinks the polymer in the exposed region, and the unexposed areas are dissolved in water to produce the final patterns. Conductivities reported for the patterned PAni films produced by this method range from $10^{-2}$ to $10^{-5}$ S/cm, which are much lower than the value of 1 S/cm that is characteristic of the best films of unsubstituted PAni films (and again several hundred times worse than typical values for PPy films). For a description of this method, see: M. Angelopoulos, J. M. Shaw, N. C. Labianca, and S. A. Rishton, *Journal of Vacuum Science and Technology*, vol. B11, pp. 2794–2797 (1993). This method is limited to specially-derivatized PAni polymers, and the inherent requirement of derivatizing the PAni backbone with a cross-linkable group for pattern formation leads to severe degradation of the electrical properties of the conducting polymer, making it undesirable for use as an active element in LC display fabrication.

Thus, all of the above-described methods have inherent limitations with respect to their suitability for practical fabrication of high resolution patterns of highly conductive polymers on polymeric substrates. Thus, there remains a need for a process for preparing patterned conducting polymer surfaces which does not suffer from such drawbacks. In particular, there remains a need for a simple, convenient process for producing fine patterns of conducting polymers which exhibit good conductance and optical transparency.

SUMMARY OF THE INVENTION

Accordingly, it is one object of the present invention to provide a novel process for preparing patterned conducting polymer surfaces.

It is another object of the present invention to provide a simple and convenient process for preparing patterned conducting polymer surfaces.

It is another object of the present invention to provide a process for preparing patterned conducting polymer surfaces which affords patterns of conducting polymer exhibiting good conductivity properties.

It is another object of the present invention to provide a process for preparing patterned conducting polymer surfaces which affords very fine patterns of the conducting polymer.

It is another object of the present invention to provide a process for preparing patterned conducting polymer surfaces which affords patterns of conducting polymer exhibiting good optical transmission properties.

It is another object of the present invention to provide novel patterned conducting polymer surfaces prepared by such a process.

It is another object of the present invention to provide devices which contain such a patterned conducting polymer surface.

These and other objects, which will become apparent during the following detailed description, have been achieved by the inventors' discovery that patterned conducting polymer surfaces exhibiting excellent properties may be prepared by:

(a) forming a surface of a conducting polymer on a surface of a substrate;

(b) forming a surface of a blocking material on said surface of said conducting polymer in a patternwise fashion, to obtain a first patterned surface containing regions of exposed conducting polymer and regions of blocking material;

(c) treating said first patterned surface with an agent which: (i) removes said conducting polymer from said regions of exposed conducting polymer; (ii) decreases the conductivity of said conducting polymer in said regions of exposed conducting polymer; or (iii) increases the conductivity of said conducting polymer in said regions of exposed conducting polymer; and (d) removing said blocking material to obtain a second patterned surface containing an exposed pattern of conducting polymer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
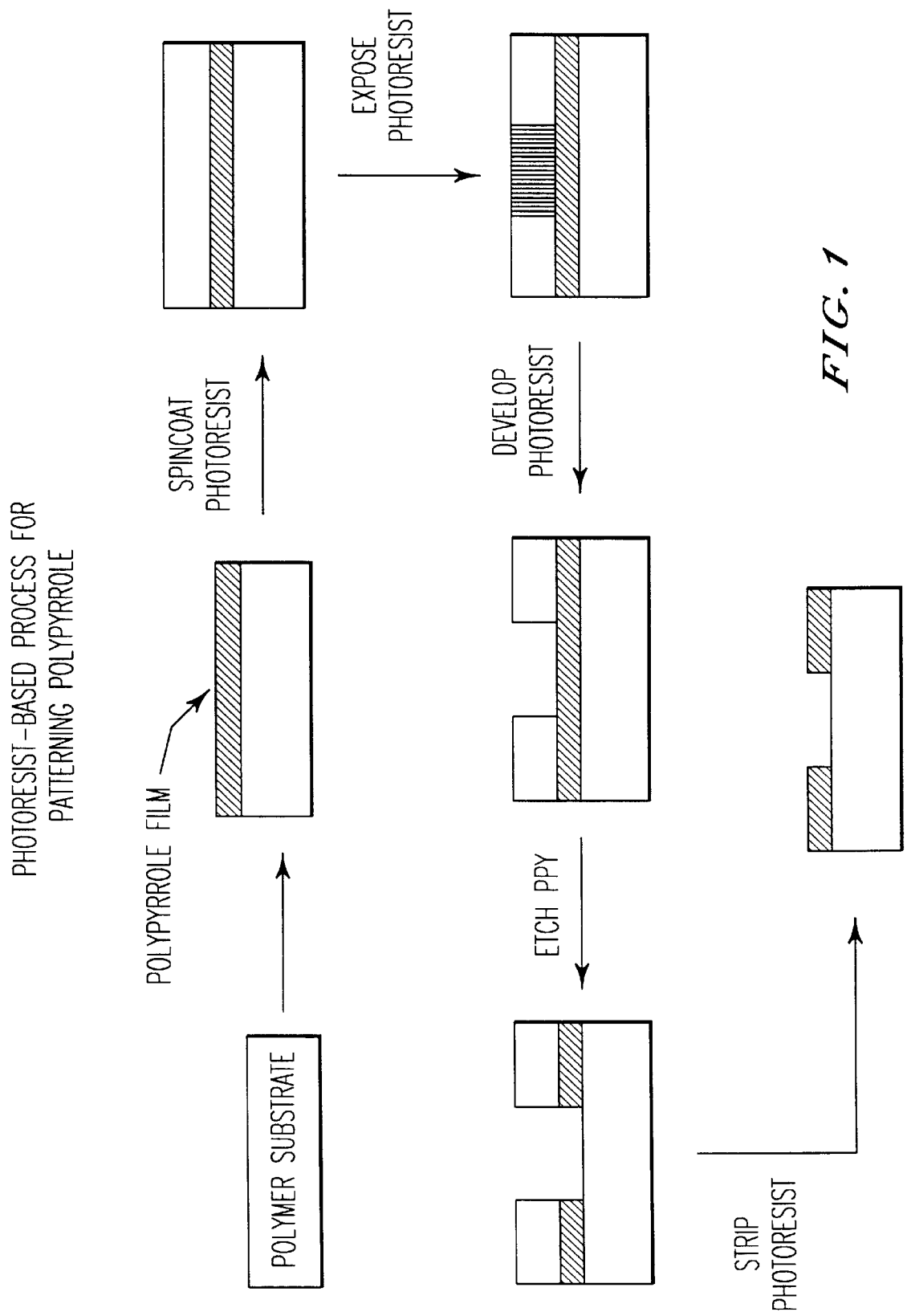
FIG. 1 is a schematic diagram of one embodiment of the present process.

Thus, in a first embodiment, the present invention provides a process for preparing a patterned surface of a conductive polymer by:

(a) forming a surface of a conducting polymer on a surface of a substrate;
(b) forming a surface of a blocking material on said surface of said conducting polymer in a patternwise fashion to obtain a first patterned surface containing regions of exposed conducting polymer and regions of blocking material;
(c) treating said second patterned surface with an agent which: (i) removes said conducting polymer from said regions of exposed conducting polymer; (ii) decreases the conductivity of said conducting polymer in said regions of exposed conducting polymer; or (iii) increases the conductivity of said conducting polymer in said regions of exposed conducting polymer; and
(d) removing said blocking material to obtain a second patterned surface containing an exposed pattern of conducting polymer.

In the first step (a), a surface of a conducting polymer is formed on a surface of a substrate. In principle, any polymer having an electrical conductivity of at least $\sigma > 10^{-3}$ S/cm, preferably at least $\sigma > 10^{-1}$ S/cm, can be used as the conducting polymer. Such conducting polymers are described in Chapter 11 of *Organic Conductors*, J. P. Farger, Ed. Marcel Dekker, NY, N.Y., 1994, which is incorporated herein by reference. Such conducting polymers include, e.g., cis and trans polyacetylenes (PA), polydiacetylenes (PDA), polyparaphenylenes (PPP), polypyrroles (PPy), polythiophenes (PT), polybithiophenes, polyisothianaphthene, polyphenylenevinylenes (PPV), polythienylvinylenes (PTV), polyphenylenesulfide (PPS), and polyaniline (PAni). For convenience, the structures of these conducting polymers are shown below.

trans-Polyacetylene:

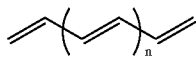

cis-Polyacetylene:

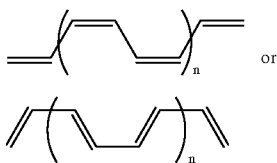

Polydiacetylene:

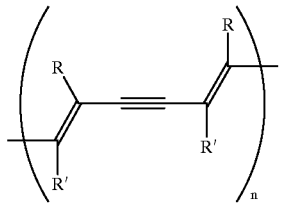

R = C$_{1-22}$-alkyl, phenyl
R' = C$_{1-22}$-alkyl, phenyl

Polyparaphenylene:

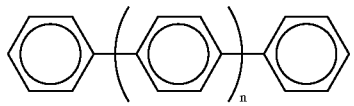

Polypyrrole:

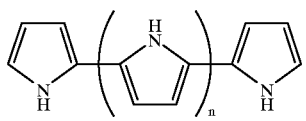

Polythiophene:

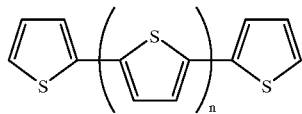

Polyisothianaphthene:

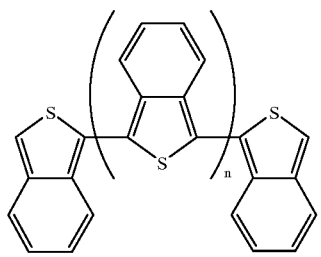

Polyphenylenevinylene:

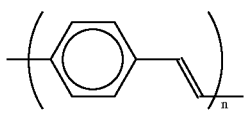

Polythienylenevinylene:

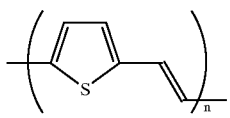

Polyphenylenesulfide:

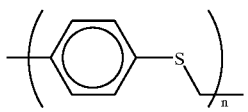

Polyaniline

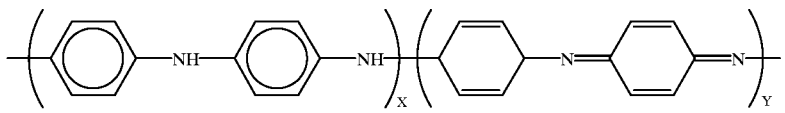

Emeraldine: X = Y

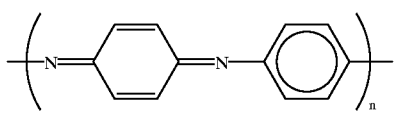

Pernigraniline

Polybithiophene:

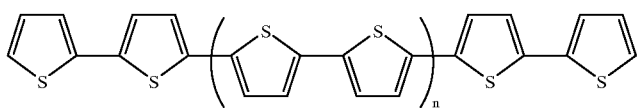

In the above-given structures, it is to be understood that H atoms may be replaced by substituents, such as $C_{1-18}$-alkyl, or phenyl or groups containing ionic groups such as carboxylate or sulfonate. These groups may be attached directly or through ester, ether, or amide links. In general, substitution worsens the electrical conductivity of the conducting polymer, but may enhance features such as solubility or orientation at the air/water interface, for example. In particular, in the case of polypyrrole, it is preferred that no substituents be present, because such substituents typically lower the electrical conductivity.

References which further describe the synthesis and properties of these conducting polymers include:

M. F. Combarel et al, *C. R. Acad. Sci. Ser. C*, vol. 262, p. 459 (1966); L. T. Yu et al, *J. Polym. Sci. Symp. C*, vol. 16, p. 2931 (1967); M. Doriomedoff et al, *J. Chim. Phys.* (Paris), vol. 68, p. 39 (1971); T. Ito et al, *J. Polym. Sci. Chem. Ed.*, vol. 12, p. 11 (1974); H. Shirakawa et al, *Chem. Commun.*, p. 578 (1977); C. K. Chiang et al, *Phys. Rev. Lett.*, vol. 39, p. 1098 (1977); P. J. Nigrey et al, *Chem. Commun.*, p. 594 (1979); A. G. MacDiarmid et al, *Synth. Metals*, vol. 1, p. 101 (1980); D. M. Ivory et al, *J. Chem. Phys.*, vol. 71, p. 1506 (1979); A. F. Diaz et al, *Chem. Commun.*, p. 635 (1979); K. K. Kanazawa et al, *Chem. Commun.*, p. 854 (1979); G. Tourillon et al, *J. Electroanal. Chem.*, vol. 135, p. 173 (1982); E. M. Genies et al, *Synth. Metals*, vol. 36, p. 139 (1990); H. W. Gibson et al, *J. Am. Chem. Soc.*, vol. 105, p. 4417 (1983); M. C. Dos Santos et al, *Phys. Rev. Lett.*, vol. 62, p. 2499 (1989); *Synth. Metals*, vol. 29, p. E321 (1989); H. Kiess, ed., *Conjugated Conducting Polymers, Springer Series in Solid State Sciences*, Vol. 102, Springer-Verlag, Berlin, 1992.

Preferably, the conducting polymer is polypyrrole (PPy) or polyaniline (PAni). It is particularly preferred that the conducting polymer be PPy. Moreover, it is especially preferred that the conducting polymer be PPy with the counterion of anthraquinone-2-sulfonate prepared in the presence of 5-sulfosalicylic acid. Such PPy can be prepared as described in R. V. Gregory et al, *Synthetic Metals*, vol. 28, p. C-823 (1989), which is incorporated herein by reference.

The substrate may be any substrate on which the conducting polymer can be formed. Preferably the substrate is a dielectric or semiconductor. Examples include inorganic substrates such as glass, quartz, silica, silicon, silicon carbide, silicon nitride, alumina, aluminum nitride, titania, titanium nitride, and diamond. Organic substrates include polymers, plastics, waxes; specific polymer materials include polyesters (e.g., polyethyleneterephthalate), polyvinylacetate, polyolefins (polyethylene, polypropylene, polyisobutylene, polybutadiene), polyethers (polyethylene oxide, polytetrahydrofuran) polyvinylmethylether, polyvinylbutylether, polyamides (Nylon 66), polyacrylamide, polyimides, polycarbonates, polysulfones, polyketones (polyvinylpyrrolidone), fluoropolymers (polytetrafluoroethylene, polyvinylidene fluoride, poly (tetrafluoroethylene-co-hexafluoropropylene)), aromatic hydrocarbon polymers (polystyrene, polystryenesulfonic acid), acrylate and acrylic acid polymers (polymethacrylate, polymethylmethacrylate (PMMA), polyacrylic acid, polymethacrylic acid), phenolic polymers (polyvinylphenol, novolak), polyvinylalcohol, polyamines (polyvinylpyridine, polyvinylbipyridine, polyallylamine, polyethyleneimine), polypeptides (polylysine), siloxane polymers (polydimethylsiloxane), halogenated polymers (polyvinylchloride, polyvinylbenzylchloride, polychlorostyrene), acetal polymers (polyvinylbutyral), epoxies, copolymers, derivatives, and mixtures of the above.

Preferred substrates for liquid crystal display applications are flexible, transparent polymers such as acrylic polymers, polycarbonate, polyethyleneterephthalate, and fluoropolymers. In a preferred embodiment, the substrate is flexible. In a particularly preferred embodiment, the substrate is a fluoropolymer which has been plasma modified as described in U.S. Pat. Nos. 4,946,903 and 5,266,309, which are incorporated herein by reference.

The surface of the conducting polymer can be formed on the surface of the substrate using any conventional method. Thus, a solution of preformed polymer may be spin-coated or dip-coated on the substrate. However, it is preferred that the conducting polymer surface be formed on the surface of the substrate by in-situ polymerization of the monomers which make up the polymer in the presence of the substrate. The in-situ formation of a surface of PPy is described in R. V. Gregory et al, *Synthetic Metals*, vol. 28, p. C-823 (1989), which is incorporated herein by reference. The in-situ formation of a surface of PAni is described in J. H. Cheung et al, *Thin Solid Films*, Vol. 244, p. 985 (1994), which is incorporated herein by reference.

The first step (a) of the present process thus yields a continuous layer of the conducting polymer on the surface of the substrate. Typically, the conducting polymer layer will be 2 nm to 1 mm, preferably 10 nm to 500 nm, thick. Control of the polymerization conditions to obtain a layer of conducting polymer having the desired thickness is within the abilities of one having ordinary skill in the art.

In the second step (b), a patterned surface of a blocking material is formed on the surface of the conducting polymer. The blocking material may be any conventional material which does not adversely affect the properties of the conducting polymer. For the purposes of the present invention, what is needed is a film of sufficient thickness that can be applied to the conducting polymer surface in a patterned fashion so that it can effectively block an etchant (or conductivity-altering reagent) for the conducting polymer in selected regions of the substrate, and then be removed to reveal patterns of conducting polymer and no conducting polymer, or conducting polymer and altered conducting polymer.

The patterned surface of blocking material may be formed by any conventional technique, such as patternwise irradiation or by physical stamping using a patterned stamp or patternwise spraying. In the case of radiation-induced patterning of the blocking material, the blocking material will be a resist and step (b) will involve the following substeps:

($b_1$) forming a surface of a resist on said surface of said conducting polymer;

($b_2$) exposing said surface of said resist to actinic radiation in a patternwise fashion to obtain a patterned surface containing regions of resist which have been exposed to said actinic radiation and regions of resist which have not been exposed to said actinic radiation;

($b_3$) developing said patterned surface obtained in step ($b_2$) to obtain a patterned surface containing regions of exposed conducting polymer and regions of remaining resist;

For radiation-induced patterning, the blocking material will be sensitive to photons (infrared, visible, UV, x-ray), ions, or electrons. A typical imaging film would then be a photoresist, ion beam resist, or e-beam resist. Descriptions of various types of imaging films, such as photoresists, e-beam resists, x-ray resists, including chemically-amplified and non-amplified photoresists, as well as positive and negative tone resists, are found in: W. Moreau, *Semiconductor Lithography—Principles, Practices, and Materials*, Plenum Press, NY, 1988, Chapters 2–5, pp. 29–258.; R. Dammel, *Diazonaphthoquinone-based Resists, SPIE Press, Bellingham, Wash.*, 1993; E. Reichmanis, S. A. MacDonald, T. Iwayanaga, *Polymers in Microlithography: Materials and Processes*, ACS Symposium Series Vol. 412, ACS Press, Washington, DC, 1989; L. F. Thompson, C. G. Willson, and S. Tagawa, *Polymers for Microelectronics: Resists and Dielectrics*, ACS Symposium Series Vol. 537, ACS Press, Washington, DC, 1992, all of which are incorporated herein by reference.

Alternatively, another method for applying a patterned blocking film would be to physically stamp or spray a blocking material onto the conducting polymer surface in the selected region, and then proceed with etching or doping of the exposed regions of the conducting polymer surface. In the case of stamping and spraying, any inert material which can be readily removed without adversely affecting the conducting polymer layer may be used as the blocking material, such as a polymeric material as described above or a nonpolymeric material such as a wax or a compound which contains a long ($C_{12-30}$) alkyl chain or other hydrophobic group.

Examples of specific commercially available e-beam resists and photoresists include: S1400, S1800, SNR-248, SNR-200, and SAL-601 (all from Shipley Co., Marlborough, Mass.); the AZ 1500, 1900, 6100, 4000, 7000 series and the AZ P4000 series (e.g., AZ-4400 and AZ-4620) photoresists from Hoechst-Celanese (Somerville, N.J.) (see AZ Photoresist Products, Hoechst Celanese Corporation, Somerville, N.J., 1995, which is incorporated herein by reference), and the e-beam resist polymethyl methacrylate (PMMA) (Aldrich Chemical Co., Milwaukee, Wis.). Preferred photoresists, due to factors such as lower cost, wide availability, and sensitivity to visible and long wavelength UV, are the diazonaphthoquinone-novolak types, exemplified by the S1400, S1800, and AZ-1500, AZ-1900, AZ-4400 and 4620 series resists.

Either a positive or a negative photoresist may be used. A positive photoresist is one in which patternwise irradiation with actinic radiation and subsequent development affords a patterned surface in which the photoresist which was irradiated is removed from the surface. A negative photoresist is one in which patternwise irradiation with actinic radiation and subsequent development affords a patterned surface in which the photoresist which was not irradiated is removed from the surface.

The surface of the photoresist may be formed on the surface of the conducting polymer by any conventional method, such as spin-coating, dip-coating, roller coating, etc. Spin coating is preferred for wafers and smaller ($\leq 12"$) substrates; Roller coating is of particular use for large area substrates, such as large area liquid crystal display substrates.

Photoresist layers for this type of process may range between 0.01 and 10 microns in thickness; typical values are 0.5–2 microns, although thicker and thinner ones may conceivably be used.

In substep ($b_2$), the surface of the photoresist is exposed to actinic radiation. The exact nature of the actinic radiation used will depend on the type of photoresist used in the second step (b).

Photoresists of the novolak-diazonaphthoquinone type are typically sensitive throughout the UV to near visible range. i.e., from ~450 nm down to 190 nm and below. Chemically-amplified photoresists are generally designed for use with high resolution exposure tools such as deep UV steppers, and are usually sensitive to radiation from about 365 nm down to 190 nm and below. For a description of the operation of optical and other radiation exposure of resists, see: W. Moreau, *Semiconductor Lithography—Principles, Practices, and Materials*, Plenum Press, NY, 1988, particularly Chapters 8 & 9 (pp. 365–458) which is incorporated herein by reference. Typical sources for photolithography include: high pressure and low pressure Hg lamps (emitting UV and visible light, operating from 185 nm thru 700), and laser sources (e.g., ArF and KrF lasers, operating at 193 nm and 248 nm, respectively).

The surface of the photoresist is irradiated in a patternwise fashion by using a photolithographic mask. A discussion of photolithographic masks and their use in contact, proximity, and projection printing can be found in W. Moreau, *Semiconductor Lithography—Principles, Practices, and Materials*, Plenum Press, NY, 1988, pp. 379–397 and 401–402, which is incorporated herein by reference. The exact geometry of the mask will depend on: (1) the pattern of the conducting polymer desired; (2) whether a positive or negative photoresist is being used; and (3) the type of agent being used in step (c).

Thus, the second step (b) affords a continuous layer of the photoresist on the surface of the layer of the conducting polymer. Control of the conditions in the method used for forming the photoresist surface to obtain a layer of photoresist having the desired thickness is well within the abilities of the skilled artisan.

When using a positive photoresist and an agent which either (i) removes the conducting polymer from the regions of exposed conducting polymer; or (ii) decreases the conductivity of the conducting polymer in the regions of exposed conducting polymer, the mask will have a geometry such that those regions of the surface on which no conductivity or reduced conductivity are desired are irradiated and those regions of the surface which are desired to exhibit good conductivity are not irradiated. When a negative photoresist and an agent which (iii) increases the conductivity of the conducting polymer are used, the same type of mask may be used.

Alternatively, when a positive photoresist is coupled with an agent of type (iii) or when a negative photoresist is coupled with an agent of type (i) or (ii), then the mask will have a geometry such that those regions of the surface on which no conductivity or reduced conductivity are desired are not irradiated and those regions of the surface which are desired to exhibit good conductivity are irradiated.

The time of the irradiation will depend on the intensity and wavelength of the irradiation source and the thickness of the photoresist layer. The adjustment of the radiation time to achieve complete irradiation of the desired regions of the photoresist surface is well within the abilities of the skilled artisan.

Thus, substep ($b_2$) of the present process yield a first patterned surface which contain regions of photoresist which have been exposed to actinic radiation and regions of photoresist which have not been exposed to actinic radiation.

In substep ($b_3$), the patterned surface obtained in substep ($b_2$) is developed to remove regions of photoresist. The development is typically carried out by contacting the first patterned surface with a reagent or solvent which selectively removes photoresist on the basis of whether or not the photoresist has been exposed to actinic radiation. When using a positive photoresist, the developing step will result in the selective removal of the photoresist from those regions of the surface which have been irradiated. When using a negative photoresist, the developing step will result in the selective removal of the photoresist from those regions of the surface which have not been irradiated. Suitable developing reagents or solvents are described in Chapter 10 of Moreau et al, *Semiconductor Lithography—Principles, Practices, and Materials*, Plenum Press, NY, 1988, pp. 459–544, which is incorporated herein by reference.

Thus, substep ($b_3$), affords a patterned surface which contains regions of exposed conducting polymer and regions of remaining photoresist. Control of the conditions, such as time, temperature and concentration, to ensure complete development in substep ($b_3$) is also well within the abilities of the skilled artisan.

In step (c) of the present process, the first patterned surface obtained in the step (b) is treated with an agent which: (i) removes the conducting polymer from the regions of exposed conducting polymer; (ii) decreases the conductivity of the conducting polymer in the regions of exposed conducting polymer; or (iii) increases the conductivity of the conducting polymer in the regions of exposed conducting polymer.

Examples of agents which (i) remove the conducting polymer from the regions of exposed conducting polymer include both physical and chemical etchants. Examples of physical etchants include ion milling (e.g., Ar ion bombardment), which would etch the PPy and blocking material at comparable rates, and therefore remove the PPy before the blocking material was eaten away. This requires a complicated, expensive tool and is less preferred. Chemical etchants may take the form of a solution or vapor phase. Examples of vapor phase etchants include an oxygen or air plasma, that oxidize and eat away the resist and PPy at comparable rates. The ion milling and plasma etching approaches are good with photoresist masking, because the resist is thick compared to the conducting polymer. For solution etching, there are two main requirements of the etchant: the conducting polymer has to either be soluble in the solution, or be converted to a soluble species in the etchant, and the etchant must also not dissolve or distort the blocking material.

Since photoresists are generally soluble or swellable in many organic solvents (see discussion on resist stripping below), especially polar ones, most organic solutions are unsuitable as selective etchants for the conducting polymer which will not also attack the photoresist. PPy is generally an insoluble material. Therefore, the polymer PPy could not be readily synthesized and then cast into films for applications. It is for this reason (as well as overall process simplicity) that the in-situ deposition process is of such importance. Organic solutions are also less preferred than aqueous solutions for disposal purposes.

There are a number of reports in the literature of electrochemical or chemical oxidation of PPy with various reagents, including oxygen in the presence of water, $PbO_2$, $Ag^+$, $Cu^{2+}$, $Fe^{3+}$, $Br_2$, $I_2$, Spectroscopic studies suggest that oxidation of PPy with these reagents involves changes such as hydroxylation of the pyrrolyl nitrogen or conversion of pyrrole ring methylene groups to ketone or carboxylic acid functionalities, but does not substantially break up the polymer into soluble material (see: G. B. Street, T. C. Clarke, M. Krounbi, K. Kanazawa, Y. Lee, P. Pfluger, J. C. Scott, and G. Weiser, *Molecular Crystals and Liquid Crystals*, Vol. 83, pp. 253–264 (1982); C. Kakouris, J. A. Crayston, and J. C. Walton, *Synthetic Metals*, Vol. 48, pp. 65–77 (1992); P. A. Christensen and A. Hamnett, Electrochimica Acta, Vol. 36, pp. 1263–1286 (1991); J. Lei, W. Liang, and C. R. Martin, *Synthetic Metals*, Vol. 48, pp. 301–312 (1992). In fact, Street reports that oxidation with $Ag^+$, $Cu^{2+}$, $Fe^{3+}$, $Br_2$, $I_2$ serves to increase the conductivity of the PPy, whereas oxidation with air or oxygen results in decreased conductivity.

The only report that describes dissolution of PPy by proposed degradation into monomeric, dimeric, and other soluble fragments is the report by C. C. Chen and K. Rajeshwar, *J. Electrochem. Soc.*, Vol. 141, pp. 2942–2946 (1994). Here, chloride ion was electrochemically oxidized to hypochlorite at a PPy coated electrode and the disintegration and dissolution of the PPy from the electrode was observed. No suggestion was made for using the electrochemically generated hypochlorite for patterning PPy; in fact, the work revealed this reaction to be a deleterious side effect in the use of PPy as an electrode coating for battery cells using chloride ion electrolytes.

Thus, $OCl^-$ is the only reagent reported in the literature that can function as an etchant for PPy. Also, as it does not dissolve or degrade the photoresist, it is ideal as an etchant for the present process. Ceric (IV) ammonium sulfate has now been found to function as an etchant by removing the PPy from the substrate. The mechanism of its operation is unknown. Both hypochlorite and Ce(IV) are strong oxidants, with formal potentials of +1.63 V (vs. NHE) and 1.44V (vs. NHE), respectively. However, oxidation potential is not the only important factor, as $PbO_2$, which is reported by Kakouris to oxidize PPy, but not dissolve it, has a formal potential of +1.46V—greater than that for Ce(IV). Hydrogen peroxide, manganese dioxide, nitric acid, and perchloric acid, all shown in Example 2 below to have little effect on the dissolution of PPy, have formal potentials of +1.78V, +1.21V, +0.94V, and +1.19V, respectively. All of these oxidants can be compared to the electrochemical potential for oxidation of PPy, which is ~–0.2V; so every one of the oxidants mentioned above has in excess of 1V driving force for the oxidation of PPy, yet only two reagents were found to be able to dissolve (as well as presumably oxidize) PPy.

Other agents which may be used for PPy removal are strong, aqueous oxidants and include: permanganate ion ($MnO_4^-$, +1.49V), dichromate ion ($Cr_2O_7^{2-}$, +1.33V), bromate ion ($BrO_3^-$, +1.52V), hypobromite ion ($BrO^-$, +1.6V), nitric oxide (NO, +1.59V), hypoiodite ($OI^-$, +1.45V), and persulfate ion ($S_2O_8^{2-}$, +2.0 V). All electrochemical potentials were taken from the *CRC Handbook of Chemistry and Physics*, 53rd Edition, CRC Press, 1972–73, pp. D113–115.

Hypochlorite salts and cerium (IV) salts are preferred. The gegen ion may be any that does not interfere or have a deleterious effect. In the case of hypochlorite, Na and K may be mentioned as suitable cations. In the case of Ce(IV), the ammonium sulfate salt has been found to be useful.

On the other hand, PAni can be synthesized in a soluble polymer form and then cast or deposited onto a substrate (we use dimethylacetamide; solubility in dimethylformamide, N-methylpyrrolidone, or aqueous acids has been reported; see K. F. Schoch, W. A. Byers, L. J. Buckley, *Synthetic Metals*, Vol. 72, pp. 13–23 (1995); K. G. Neoh, M. Y. Pun, E. T. Kang, and K. L. Tan, *Synthetic Metals*, Vol. 73, pp. 209–215, (1995)). However, the same general types of solvents that dissolve the PAni also will likely swell or dissolve the photoresist. So, it is not obvious at this point whether the solution-based removal approach can identify the proper combination of etchant and resist stripper systems. Preferred oxidizing agents include salts of hypochlorite, such as potassium or sodium hypochlorite, and ceric ammonium sulfate.

As shown in the Examples given below, removal of PPy by the hypochlorite and Ce(IV) etchants was essentially complete within seconds. Typically, these oxidizing agents will be applied to the first patterned surface in the form of an aqueous solution. In the case of hypochlorite, 0.001 wt. % to 50 wt. % solutions in water are suitable, and 1 wt. % to 10 wt. % solutions are preferred. In the case of cerium ammonium sulfate, $10^{-4}$ to 10 M in water solutions are suitable, and $10^{-2}$ to 1 M solutions are preferred. Typically, the first patterned surface will be treated with the oxidizing agent at 15 to 95° C. preferably 20 to 30° C., for a time of 0.1 to 100 minutes, preferably 1 to 10 minutes. The control of the exact conditions to achieve complete removal of the exposed conducting polymer is well within the abilities of those having ordinary skill in the art.

Of course, it is to be understood that it is not necessary to remove all of the conducting polymer from the regions of exposed conducting polymer. Rather it is only necessary to remove sufficient conducting polymer so that the conductivity in the regions of exposed conducting polymer is decreased to a level significantly below that of the conducting polymer in the unexposed regions. For example, in the case of PPy, a 15 nm thick layer will typically have a conductivity of 500 S/cm. Since the conductivity of the PPy decreases with decreasing thickness, removal of only a portion of the PPy from the exposed regions will result in a decreased conductivity in those regions. A decrease in conductivity by a factor of 100 is easily achievable even without removing all of the conducting polymer from the exposed regions. When the patterned surface of conducting polymer is being used as a circuit or in a biochemical sensor, a decrease in conductivity by a factor of 10%, preferably 50%, is sufficient to result in selective conduction through the regions of higher conductivity. When the present patterned surface is being used in a liquid crystal display, it is preferred that the conductivity of the exposed regions of conducting polymer be reduced such that the ratio of the conductivity of the untreated conducting polymer to the conductivity of the treated conducting polymer be at least $10^3$, preferably $10^4$.

The change in surface resistance that was obtained in Example 2 below, was a decrease of ~150×. Specifically, in one example, for a starting value of surface resistance for PPy of 2.5 kohm/sq (kohm=$10^3$ ohm), treatment with MF-312 developer (tetramethylammonium hydroxide aqueous solution) produced a surface resistance of ~305 kohm/sq, giving a change of 122×.

The effect of having regions of higher vs. lower surface resistance with respect to liquid crystal switching is to flatten and spread the intensity vs. voltage curve. Differential switching in one region vs. another occurs but depends strongly on the switching voltage frequency. Thus, the liquid crystal LC switching characteristics of those regions would be different, which may be used in a display configuration.

Examples of agents which (ii) decrease the conductivity of the conducting polymer in the exposed regions of conducting polymer include hydroxides of the formula $R_{4-x}NH_x^{30}$, in which R is $C_{1-4}$-alkyl and x is an integer of 1 to 4 and aerial oxidation. Especially preferred is tetramethylammonium hydroxide. As in the case of the agents of type (i), the agents of (ii) are typically applied to the second patterned surface in the form of an aqueous solution. In the case of $R_{4-x}NH_x^+OH^-$, $10^{-4}$ to 10 M solutions are suitable, and $10^{-2}$ to 1 M solutions are preferred.

The exact conditions of treatment with the agent of type (ii) will of course depend on the exact nature of the agent and the conducting polymer. In the case of a 0.27 M aqueous solution of tetramethylammonium hydroxide and PPy, good results may be achieved using treatment times of 0.1 to 100 minutes, preferably 1 to 10 minutes, and temperatures of 15 to 95° C., preferably 20 to 30° C. As noted above, when the present patterned surface is to be used as a circuit or in a biochemical sensor, the treatment of the second surface with the agent of type (ii) is suitably carried out so that the conductivity of the conducting polymer in the regions of exposed conducting polymer is reduced by a factor of 10%, preferably 50%. However, when the patterned surface is to be used in a liquid crystal display, greater reductions are necessary as described above.

Examples of suitable agents of the type (iii) which increase the conductivity of the exposed conducting polymer include strong protic acids, super acids, various oxidants (see page 27 and Example 2), and electrochemical oxidation. Preferred agents of type (iii) include HCl, $HNO_3$, and $HClO_4$. Again, the second patterned surface will typically be treated with an aqueous solution of the agent of type (iii). In the case of strong protic acids, such as HCl, $HNO_3$, $HClO_4$, and $H_2SO_4$, $10^{-4}$ to 10 M solutions are suitable, and $10^{-3}$ to 1 M solutions are preferred.

The exact time and temperature used when treating the second patterned surface, will depend on the identity of the agent of type (iii) and the conducting polymer. In the case of a 1 M solution of $HNO_3$ and PPy, good results may be achieved using a treatment time of 0.1 to 100 minutes, preferably 1 to 10 minutes, and a temperature of 15 to 95° C., preferably 20 to 30° C. When the patterned surface of conducting polymer is to be used as a circuit or in a biochemical sensor, the treatment with the agent of type (iii) is suitably carried out so that the conductivity of the exposed conducting polymer is 10%, preferably 50%, greater than that of the conducting polymer in the unexposed regions.

Thus, step (c) affords a surface which contains regions of blocking material (remaining photoresist in the case when substeps ($b_1$), ($b_2$) and $b_3$) are used) and regions in which: (i') at least a portion of the conducting polymer has been removed; (ii') the conductivity of the exposed conducting polymer has been decreased; or (iii') the conductivity of the exposed conducting polymer has been increased.

In step (d), the blocking material is removed. Typically, the remaining photoresist will be removed by washing with a solvent or stripper. The exact solvent will depend on the identity of the photoresist. Strippers for resists are described in Chapter 14 of W. Moreau, *Semiconductor Lithography— Principles, Practices, and Materials*, Plenum Press, NY, 1988, pp. 779–812, which is incorporated herein by reference. The objective here is to strip the resist without adversely affecting the conducting polymer that remains on the surface. Strippers can be:

1) Organic solvents, typically polar solvents such as chlorinated hydrocarbons (e.g., methylene chloride), ketones (acetone, methyl ethyl ketone, methyl isobutyl ketone, N-methylpyrrolidone), esters, alcohols, dimethylsulfoxide. Preferred are non-toxic solvents like acetone that have been shown (Ex. 2),not to affect PPy; or 2) Aqueous strong acid or base solutions.

In the case of the photoresist S1400, acetone is the preferred solvent. The selection of a suitable solvent for a given blocking material is within the abilities of those of ordinary skill in the art.

Removal of the blocking material in step (d) affords a surface containing regions of exposed conducting polymer having a conductivity substantially equal to that of the conducting polymer surface formed in the first step (a) and regions in which: (i') at least a portion of the conducting polymer has been removed; (ii') the conductivity of the exposed conducting polymer has been decreased; or (iii') the conductivity of the exposed conducting polymer has been increased.

In cases (i) and (ii), the regions of conducting polymer which were not exposed and which were not treated with an agent in step (e) will have a higher conductivity than the regions (i') and (ii'). In the case (iii), the regions of conducting polymer which were not exposed and which were not treated with an agent in step (c) will have a lower conductivity than the regions (iii').

By means of the present process, it is possible to obtain surfaces having an exposed pattern of conducting polymer in which the pattern of conducting polymer has any geometry or pattern which is conventionally achievable using photolithographic techniques. Thus, it is possible to achieve patterns in which the line width of the regions of high conductivity or low conductivity is as fine as 0.1 micron linewidths using current state-of-the-art optical lithography techniques, and ~10 nm or below using state of the art electron-beam or ion beam exposure tools.

The patterned surfaces of conducting polymer produced by the present process may be used as the conductive element in a liquid crystal display device. Thus, the present patterned surface can be used as a replacement for a conventional patterned surface of ITO in a liquid crystal display device. However, as alluded to above, due to the flexible nature of the conducting polymers, it is preferred that the present patterned surface of conducting polymer be present on a flexible substrate and constitute the conductive element in a flexible liquid crystal display device.

FIG. 1 is a schematic diagram of one embodiment of the present method. In the first step, a film of PPy is formed on a polymer substrate. In the second step, a layer of photoresist is spincoated on the PPy. In the third step, the photoresist is exposed to actinic radiation in a patternwise fashion. In the fourth step, the exposed photoresist is developed to remove the photoresist from the regions which were exposed to actinic radiation in the third step and to expose regions of PPy. In the fifth step, the exposed PPy is removed by etching, and in the sixth step, the remaining photoresist is removed.

The present invention will now be explained in further detail in the context of PPy. However, it is to be understood that the good effects of the present invention may be achieved using other conducting polymers.

This invention describes a simple, practical process for producing high resolution patterns of a conducting polymer on polymeric substrates. This approach has not been described or contemplated in any of the previous reports on the patterning of conducting polymers. Thin films of PPy can be deposited by the in-situ method onto plasma-modified fluoropolymeric substrates using previously described procedures. A photoresist is then applied to the conducting polymer film. The photoresist is exposed with UV light through a contact mask, and is developed to form a pattern of photoresist on top of the PPy film. An aqueous solution of sodium hypochlorite or other reagent is then applied to the photoresist-coated PPy to remove the PPy film from the regions not protected by the photoresist. Finally, the photoresist is dissolved from the surface using a solvent such as acetone, leaving patterns of electrically conductive PPy on the fluoropolymer substrate. A schematic description of this process is shown in FIG. 1. The PPy-patterned substrate is then used as the pattern-forming conductive element in a liquid crystal display.

In a variation of the present invention, the PPy is deposited onto the fluoropolymer substrate as above and the photoresist is applied, exposed with UV light, and developed with an aqueous solution of tetramethylammonium hydroxide (TMAH)—a conventional commercial photoresist developer. The TMAH increases the surface resistance (and decreases the electrical conductivity) of the PPy by a factor of ~150, but does not remove the PPy from the substrate. The photoresist is then dissolved from the substrate as above. In this case, the highly conductive PPy regions can be used as the active regions of an LC display, whereas the more highly resistive, base-treated regions will not switch as effectively at the same applied voltage and do not function as active areas. This configuration may be preferred in applications where the complete removal of the PPy film is not desired. In this embodiment, steps (d) and (e) are combined.

Finally, certain reagents such as hydrochloric acid, nitric acid, sulfuric acid, and perchloric acid as well as those reported in the literature have been found to decrease the surface resistance (and increase the conductivity) of as-formed PPy films by up to a factor of 3. Treatment of PPy films, either before or after photoresist patterning procedures described above, can be used to optimize the electrical characteristics of the PPy for display applications.

Materials and methods for producing patterns of conducting PPy patterns on fluoropolymeric substrates are described in the examples below. However, the photoresist patterning method, coupled with appropriate reagents for either removal, impairment, or enhancement of the electrical properties of the conducting polymer is a general concept that can include non-fluoropolymeric substrates (including inorganic and other polymeric materials), other conducting polymers (such as polyaniline, polythiophene, polyacetylene), and other etchants (solution phase or plasma). The patterned conducting polymers produced by this approach can be used for liquid crystal displays, sensors or transducers for electrochemical, radiation, temperature, or acoustical input, microelectronic circuitry, or other applications where patterns of electrically conducting polymers are required.

Other applications of the patterned conducting polymers afforded by the present invention include: actuators; antiradiation coatings; antistatic coatings and carpets; coatings, fibers, films, paints, etc.; artificial muscles; batteries (lightweight, high energy density, rechargeable, flexible, odd-shaped); capacitors and supercapacitors; catalysts; coating for initiating electroless or electrolytic metal plating on dielectric substrates; conductors (lightweight); controlled-release medicine delivery systems; corrosion-preventive paints; displays; electrochromic and electroluminescent displays; smart windows; electrodes (catalysts, fuel cells, etc.); electromagnetic shielding; electromechanical actuators for biomedical devices, micropositioners, microtweezers, microvalves, etc.; electron-beam resists; field effect transistors; fuses (reversible)-gas separation membranes; heating elements (e.g., clothing); infrared reflectors; photolithographic resists; loudspeakers (electrostatic); memory devices (electrical, optical); molecular electronics; micro- or nanoelectronic circuitry; nonlinear optics; packaging materials; pH modulator; polymer/solid electrolytes; semiconducting devices: p-n junction, photovoltaics, Schottky diodes, light-emitting diodes, transistors, etc.; and transparent conductors.

Such applications are discussed in J. S. Miller, *Adv. Mater.*, Vol. 5, p. 587 (1993) and in Moreau, pp. 759–823, which are incorporated herein by reference.

A polymer or glass fiber coated with PPy or other conducting polymer in a selected region may be used as a biocompatible electrochemical sensor that may be inserted or implanted into a cell or other small area. It has recently been reported that neurons may be stimulated by voltages applied to a conducting polymer-coated plastic; there was no pattern definition involved. The present invention may be used to provide electrical stimulation to neural networks much like those currently produced on glass substrates. Acoustic sensors may be fabricated by putting PPy electrodes onto a piezoelectric polymer such as polyvinylidene fluoride. These sensors become more sensitive as they have less mass to displace, and using a lightweight conducting polymer, rather than a metal electrode, could yield improved acoustic sensors. Conducting polymers have high electrical conductivity, but poor thermal conductivity and, as such, may be used to prepare improved pyroelectric detectors, because current materials are much better thermal conductors and spread heat, thereby lowering the resolution of the thermal image.

In addition, the present patterned surfaces of conducting polymers may be used as a plating base for the patternwise plating of a metal onto the surface. The present patterned conducting polymers may be used as a plating base for either electroless plating or electroplating (in which current is passed through the conducting polymer) of metals as circuit traces, vias, or interconnects on nonconductor substrates.

Other features of the invention will become apparent in the course of the following descriptions of exemplary embodiments which are given for illustration of the invention and are not intended to be limiting thereof.

EXAMPLE 1

Fabrication of PPy Films on Plasma-Modified FEP Substrates

Conductive films of polypyrrole were deposited onto modified tetrafluoroethylene-co-hexafluoropropylene (FEP) films (obtained from DuPont Co., Wilmington, Del.) using the in-situ polymerization method. A transparent film of FEP was cut into a 1.5×1.5 inch square and then ultrasonically cleaned in methanol for 30 sec. The FEP was then placed into a Harrick radio frequency glow discharge (RFGD) plasma cleaner (Model PDC-23g) which was modified with an in-line high vacuum leak valve for controlling gas flow and chamber pressure. A mixture of $H_2$ and methanol was then introduced into the plasma chamber under constant flow conditions such that a constant pressure of 100 mTorr was achieved. The FEP film was then exposed to a plasma for 1.5 min. After removal from the plasma chamber the modified FEP film was then ultrasonically washed in methanol. This process controllably defluorinates the FEP film and produces hydroxyl (—OH) groups on the surface of the polymer. The plasma modification process has been described in U.S. Pat. Nos. 4,946,903 and 5,226,309, which are incorporated herein by reference.

Deposition of conducting films of polypyrrole (PPy) onto modified FEP was done using an in-situ polymerization technique. Pyrrole monomer (0.6 mL) was dissolved with magnetic stirring in 100 mL of DI water (200 mL beaker, room temperature) during 15 minutes. In a separate 400 mL beaker, ferric chloride (3.5 g) was dissolved with magnetic stirring in 100 mL of DI water. After 5 minutes stirring at room temperature, 0.98 g of anthraquinone-2-sulfonic acid sodium salt (AQ2SA) was added to the ferric chloride solution. This solution was stirred for 5 more minutes to dissolve the AQ2SA. Then, 5.34 g of 5-sulfosalicylic acid sodium salt (SSA) was added, and the solution was stirred for 5 more minutes to dissolve the SSA completely.

Polymer substrates were immersed inside the 400 mL beaker. The entire 100 mL of pyrrole solution was added quickly (during 1–2 seconds) to the beaker containing the ferric chloride mixture, completely immersing the polymer substrates into the deposition solution. After 5–15 minutes in the deposition solution, the substrates were coated with thin PPy films and were removed from the beaker. Shorter deposition times yielded films of higher transparency and higher surface resistance than those deposited at longer times. The PPy films were ultrasonically cleaned in a 400 mL beaker filled with DI water for 30 sec, ultrasonically cleaned in methanol for 2 min, and then rinsed in methanol for 20 sec. The PPy films were then dried under nitrogen flow.

The PPy films on the FEP substrates were characterized by UV-Vis-NIR spectroscopy and by 4-point probe resistance measurement. Measurement of the intensity of the 550 nm peak of the PPy film by UV spectroscopy gave both the transparency and thickness of the PPy film. Typical transparencies ranged from 50–85% transmission at 550 nm; values of film thickness ranged from 10 to 25 nm (using the conversion factor of 0.0375 Absorbance units=3.5 nm thickness). Electrical measurements of the PPy films were made using a Signatone model 4-point probe with a Keithley model 196 Voltmeter and Keithley model 224 power supply. Typical values of surface resistance for as-prepared films ranged-between 600–4000 ohm/sq, although some preparations yielded PPy films with surface resistances as high as 10K ohm/sq; corresponding electrical conductivities ranged between 100–1300 S/cm. PPy films allowed to stand in air under ambient conditions generally exhibited an increase in surface resistance over a period of several days; stabilizing at values typically ranging between 5–10 kohm/sq. PPy films for display fabrication were used as soon as possible after deposition to avoid oxidative degradation.

EXAMPLE 2

Effect of Various Reagents on the Electrical Properties of PPy Films

Films of PPy on FEP substrates, prepared as described in Example 1, were treated with various solution reagents for times ranging from 30 sec to 10 min, and the change in surface resistance of the PPy film was measured using the four-point probe technique. Although PPy films for these experiments were taken from the same preparation, the surface resistance values from sample to sample can vary by a factor of 2–3, so the changes in surface resistance are reported normalized to the initial value of the PPy film prior to exposure to the reagent. For the results shown in the Table below, the initial surface resistance values for the PPy films ranged from 2 Kohm/sq to 6 Kohm/sq.

It should be noted with regard to the surface resistance changes that if the PPy film is of the highest quality, i.e., lowest starting surface resistance/highest conductivity values, then the acid doping has little affect. The data in the table was obtained for films of moderate quality, where the additional increase in doping level could be discerned. However, the base-induced undoping was effective regardless of the initial PPy surface resistance—for the typical ranges produced above.

The reagents and their effect on the surface resistance are listed below for 1 min immersion times at 22° C.:

| Reagent | Surface Resistance ($R_1$) Change |
| --- | --- |
| 1:1 MF-312 developer (see Ex. 3) | Increased 142x |
| Conc. $NH_4OH$ | Increased 82x |
| 4M NaOH (aq) | Increased 1.3x |
| 1M $CH_3COOH$ | Increased 1.4x |
| 30% $H_2O_2$ | Increased 1.9x |
| 1M HCl | Decreased 2.0x |
| 1M $H_2SO_4$ | Decreased 1.7x |
| 1M $HNO_3$ | Decreased 3.2x |
| 1M $HClO_4$ | Decreased 1.9x |
| 1M $NaNO_3$ | Decreased 1.4x |
| 0.1M $AgNO_3$ | Unchanged (<10%) |
| 1M $MnO_2$ in 1M HCl | Decreased 2.5x |
| Clorox bleach (5.25% NaOCl (aq)) | Removed film |
| 0.1M $(NH_4)_2Ce(SO_4)_3$ | Removed film |
| Acetone | Increased 1.4x |

These data show that reagents such as MF-312 developer and ammonium hydroxide severely impair the surface resistance (and therefore the electrical conductivity) of PPy films; acidic reagents can improve $R_1$ and σ by ~2–3×; acetone which is employed in the photoresist removal step (See Examples 2 and 3) does not materially affect the electrical properties, and strongly oxidizing reagents such as sodium hypochlorite and ceric ammonium sulfate dissolve the PPy film and remove it from the fluoropolymer substrate.

EXAMPLE 3

Fabrication of Patterned PPy Films Using Sodium Hypochlorite Etchant

Figure 2A:
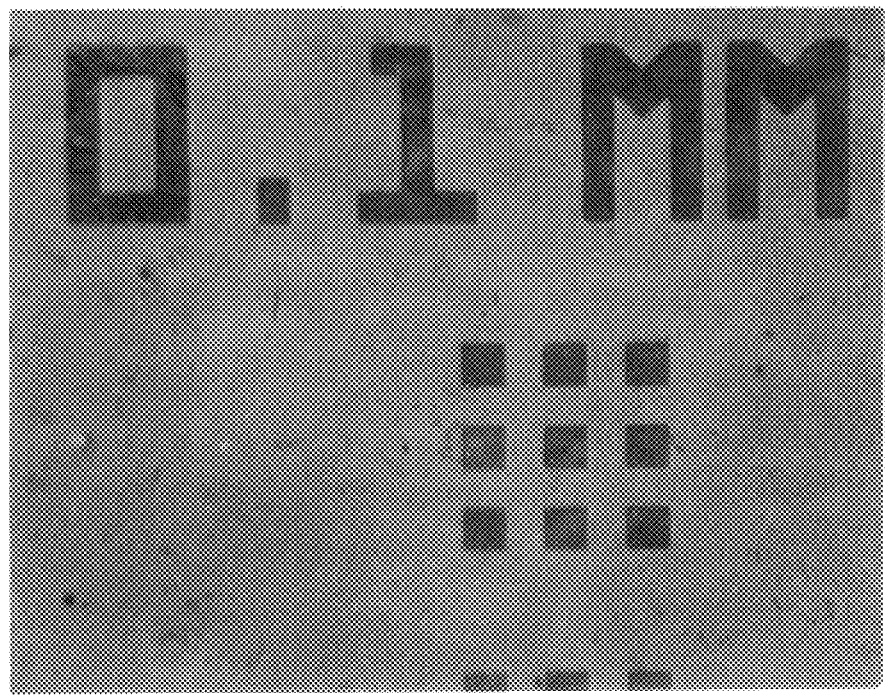
FIGS. 2*a* and *b* are optical micrographs of patterned surfaces prepared by the present process.
Figure 2B:
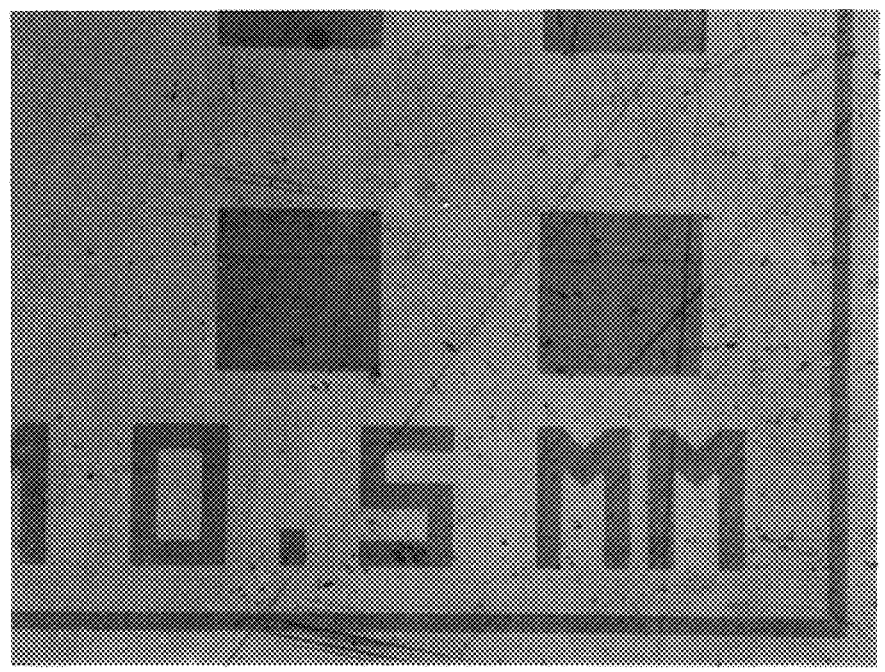
Figure 3:
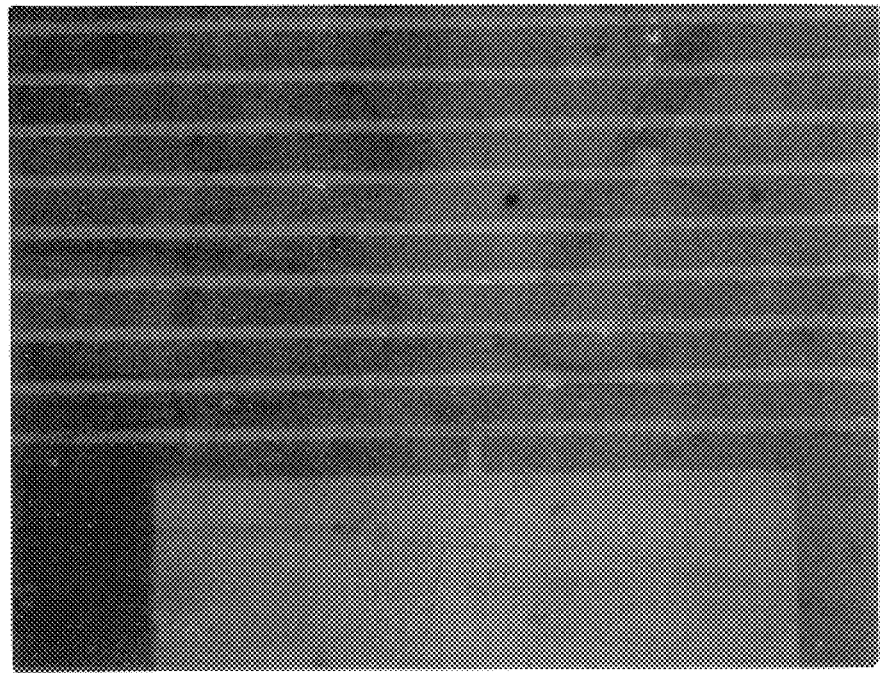
FIG. 3 is a micrograph of a patterned surface prepared by the present process.
Figure 4:
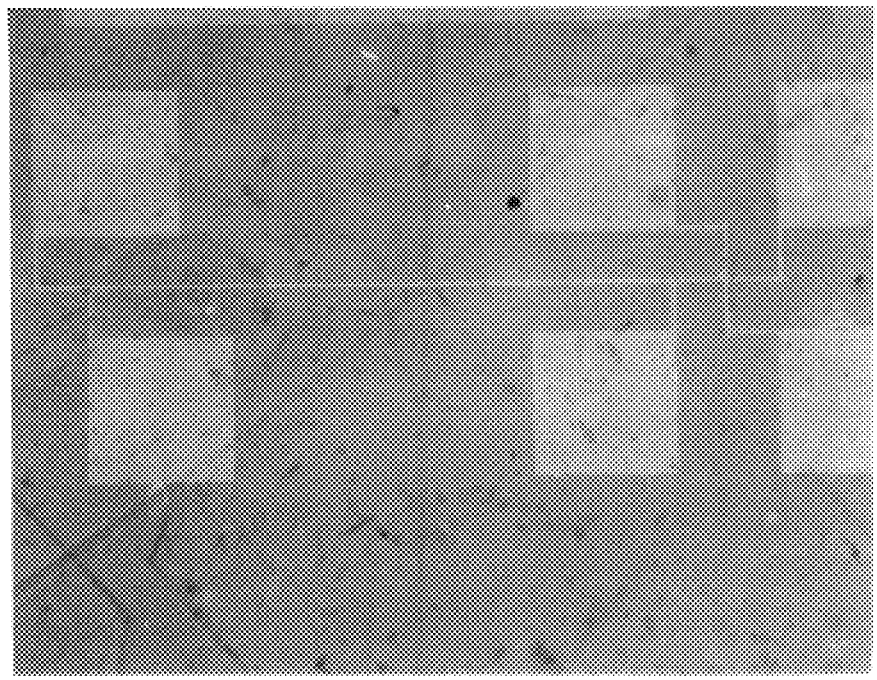
FIG. 4 is a micrograph of a patterned surface prepared by the present process.

Polypyrrole-coated FEP substrates were produced as described in Example 1. The PPy-coated substrate was spin-coated with 1.2 μm thick film of S1400-27 photoresist (Shipley Co.). The photoresist was exposed to 20 sec (total dose—200 mJ/cm$^2$) of patterned UV (365–405 nm) radiation using a Hg/Xe lamp-based contact printer (Karl SUss Co.) with a chrome-on-glass contact mask. The exposed photoresist was dissolved using MF-312 developer (Shipley Co.) at 1:1 dilution with DI water (the diluted solution is composed of 0.27N tetramethylammonium hydroxide, TMAH) for 1.5 min and was rinsed with DI water. The substrate was then immersed in a solution of Clorox® bleach (aqueous sodium hypochlorite) for 30–60 sec to dissolve the PPy film from the regions left unprotected by the photoresist; the substrate was then rinsed with DI water and dried under a stream of nitrogen. The photoresist was then removed by immersing the substrate in acetone for 1 min, and the substrate was rinsed with DI water and dried. Examination of the substrate by optical microscopy showed patterned regions of polypyrrole that replicated the patterns on the contact mask, with features having minimum linewidths of ~50 µm and sharply defined edges. The same procedure was used with a contact mask having serpentine patterns and linewidths as fine as 10 µm. Optical micrographs of the patterned PPy films are shown in FIGS. 2a and 2b, 3, and 4. In FIGS. 2a and b, the lighter regions are those in which the conducting polymer remains, and the darker regions are those in which the conducting polymer was removed. In FIGS. 3 and 4, the lighter regions are those in which the conducting polymer was removed and, the darker regions are those in which the conducting polymer remains.

The same PPy patterning procedure was used as described above, with the exception that a high resolution lithographic test mask was employed with an exposure dose of 100 mJ/cm$^2$ and a development time of 1.5 min. Inspection of PPy patterns under the optical microscope revealed patterns with minimum linewidths of 1–2 µm.

EXAMPLE 4

Fabrication of Patterned PPy Films Using Ceric Ammonium Sulfate Etchant

Polypyrrole-coated FEP substrates are produced as described in Example 1 and are coated with photoresist, exposed and developed as described in Example 2. The substrate is then immersed in an 0.1 M aqueous solution of ceric ammonium sulfate for a period of 10 min or less to remove the PPy film from the regions not protected by photoresist, rinsed with DI water and dried. The photoresist is removed by immersion in acetone as described above, leaving patterns of PPy on the FEP substrate.

EXAMPLE 5

Fabrication of Patterned PPy Films With Lowered Surface Resistance

Patterned polypyrrole-coated FEP substrates are produced as described in Example 3. After removal of the photoresist, the patterned PPy film is immersed in a solution of aqueous (1M) nitric acid for 1 min, rinsed with DI water and dried. The acid dip decreases the surface resistance of the PPy by a factor of ~3×.

EXAMPLE 6

Fabrication of Patterned PPy Films Using MF-312

Polypyrrole-coated FEP substrates were produced as described in Example 1 and were coated with photoresist, exposed and developed as described in Example 2. The MF-312 developer degrades the electrical properties of the PPy film in the regions unprotected by the photoresist. The photoresist is then stripped with acetone as described above. The fluoropolymer substrate now has patterns of highly conductive PPy film corresponding to the regions that were protected by the photoresist; in the other areas, damaged PPy with ~150× higher surface resistance remain.

EXAMPLE 7

Fabrication of a Liquid Crystal Display Using Patterned PPy Films

An unpatterned PPy-coated fluoropolymer substrate (~2" square) was produced as described in Example 1. A patterned polypyrrole-coated FEP substrates was produced as described in Example 3. A 15 µm thick Teflon spacer was inserted between the two substrates to be able to control the spacing of the cell. The PDLC device is fabricated by mixing equal weight percentages of eutectic nematic liquid crystal mixture E7 (EM Chemicals) and UV curable optical adhesive, Norland Optical Adhesive #65. Before polymerization of the Norland adhesive, the liquid crystal is dissolved in a pre-polymer, and a small amount of this homogeneous mixture is placed on the conducting polymer substrate with the spacers. The substrates are placed on top of each other with the conducting surfaces facing toward the inside of the cell with a small offset, such that the electrical contact can be made. The sample is photopolymerized for approximately twenty minutes using 360 nm UV light. Connection to an electrical power supply was made by attaching metal clips to the PPy film-coated substrate. The PDLC device, fabricated in this manner using the polypyrrole film as the conducting substrate, exhibits electrooptic switching. The voltage dependence of the intensity of transmission of the PDLC device with polypyrrole substrates shows a threshold voltage of about 15 volts beyond which the intensity attains a saturation value.

EXAMPLE 8

PDLC Device Fabricated from PPy Film on PET

Figure 5:
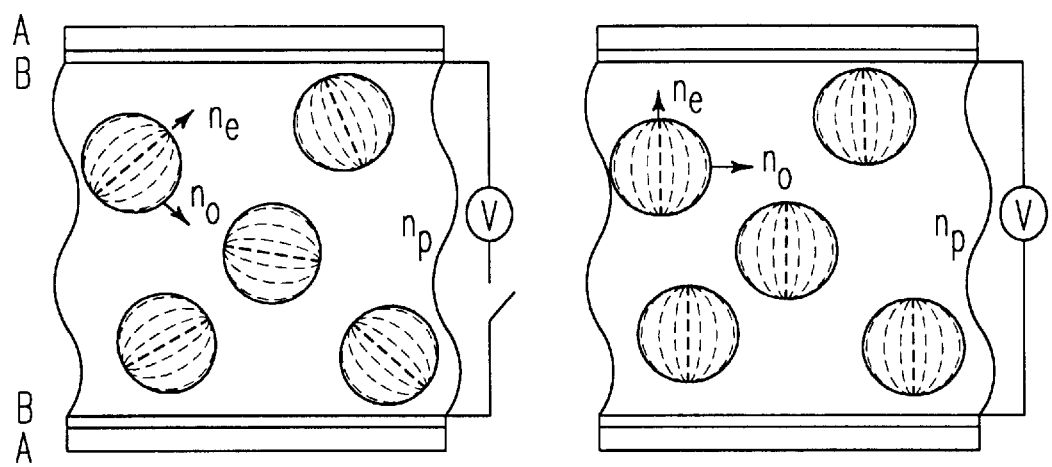
FIG. 5 is a schematic representation of a polymer dispersed liquid crystal (PDLC) display according to the present invention.

A number of PDLC devices have been fabricated using both polypyrrole and polyaniline films as electrodes. Here the fabrication and working of one type of PDLC as a typical example is described. The PDLC device was fabricated using polypyrrole coated PET as described in Example 2. A schematic diagram of this device (the diagram is generic for any type of conducting polymer film) is shown in FIG. 5. This device has a very important feature—the electrically conducting surfaces by which the voltage is applied to the device are conducting polymer films. Thus, the ITO coated glass or plastic conducting substrates of the usual PDLC devices are replaced by conducting polymer films in this device.

The conducting polymer (polypyrrole) coated PET was cut into strips of appropriate size (e.g., 5×5 cm$^2$) for the PDLC cell fabrication. To be able to control the spacing of the cell between the electrodes, one of the substrates was treated with the 15 micron size spacers. The PDLC device was fabricated by mixing equal weight percentages of eutectic nematic liquid crystal mixture E7 (EM Chemicals) and UV curable optical adhesive, Norland Optical Adhesive #65. The ordinary refractive index of the liquid crystal is nearly equal to that of the polymer (n=1.524), a prerequisite to fabricating a PDLC light shutter. Before polymerization of the Norland adhesive, the liquid crystal was dissolved in a prepolymer and a small amount of this homogeneous mixture was placed on the conducting polymer substrate with the spacers. The substrates were placed on top of each other with the conducting surfaces facing toward the inside of the cell with a small offset, such that the electrical contact can be made. The sample was photopolymerized for approximately twenty minutes in UV light (360 nm). As the pre-polymer moiety polymerizes, the low molecular weight liquid crystal is no longer soluble in the polymer binder and it subsequently phase separates from the polymer binder. The liquid crystal droplet morphology begins to form and the droplets continue to grow until the polymer binder locks in the droplet morphology and size. The PDLC device, fabricated in this manner using the polypyrrole film as the conducting substrate, exhibited electro-optic switching. The voltage dependence of the intensity of transmission of the PDLC device with polypyrrole substrates showed a threshold voltage of about 15 volts beyond which the intensity attains a saturation value. This behavior, the qualitative nature of the variation of the intensity with applied voltage, as well as the magnitude of the threshold voltage, are very similar to those in currently used PDLC devices with ITO based substrates.

EXAMPLE 9

Twisted Nematic Liquid Crystal Display Device Fabricated from PPy Film on PET

Figure 6:
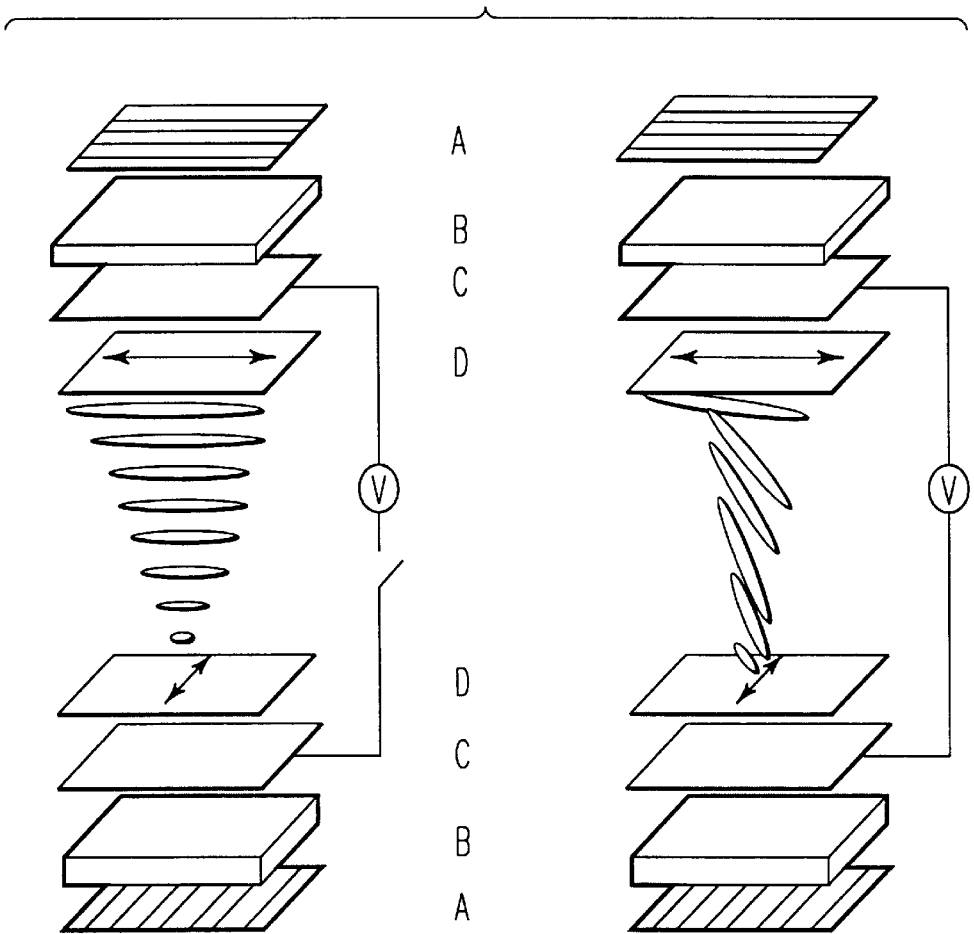
FIG. 6 is a schematic representation of a conducting polymer twisted nematic liquid crystal display according to the present invention.

A TN cell was fabricated using polypyrrole films deposited on PET as in Example 2. The cell (FIG. 6) consists of two conducting substrates, two polarizers, spacers to control the cell thickness, and eutectic nematic liquid crystal material (E7). The conducting substrates were treated (unidirectional rubbed) to create uniform parallel alignment. The substrates were sandwiched together with the conducting sides facing each other, a small offset to allow for electric connections, and with the alignment direction at the top substrates rotated at 90° with respect to the bottom substrates. The spacers (usually 3–10 microns) were placed between the substrates so as to control the cell thickness. The two opposing side edges are sealed with an epoxy glue and the cell is filled with the liquid crystal by capillary action. Placing the cell between crossed polarizers completes the TN display.

The electro-optic characteristics of a TN device, fabricated using the conducting polymer (polypyrrole) films deposited on PET as the electrode surfaces, have been investigated. The applied voltage was 24 volts across the thickness of the cell. The rise time and the off-time, evaluated from the value of the optical intensity at 10% and 90% of the intensity, are 35 ms and 54 ms. Thus, the functioning and the characteristics of a working TN device fabricated with an optically transparent conducting polymer as the conducting substrate has been demonstrated. This reduces the steps involved in the device fabrication.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A process for preparing a patterned conducting polymer surface, said process comprising:
   (a) forming a surface of a conducting polymer on a surface of a substrate;
   (b) forming a surface of a blocking material on said surface of said conducting polymer in a pattern-wise fashion, to obtain a first patterned surface containing regions of exposed conducting polymer and regions of blocking material;
   (c) treating said first patterned surface with an agent which: (i) removes said conducting polymer from said regions of exposed conducting polymer; or (ii) decreases the conductivity of said conducting polymer in said regions of exposed conducting polymer; and
   (d) removing said blocking material to obtain a second patterned surface containing an exposed pattern of conducting polymer.

2. The process of claim 1, wherein said first patterned surface is treated with an agent which removes said conducting polymer from said regions of exposed conducting polymer.

3. The process of claim 2, wherein said substrate is selected from the group consisting of glass, quartz, silica, silicon, silicon nitride, alumina, aluminum nitride, titania, titanium nitride, diamond, waxes, polyesters, polyvinylacetate, polyolefins, polyethers, polyvinylmethylether, polyvinylbutylether, polyamides, polyacrylamide, polyimides, polycarbonates, polysulfones, polyketones, fluoropolymers, aromatic hydrocarbon polymers, acrylate and acrylic acid polymers, phenolic polymers, polyvinylalcohol, polyamines, polypeptides, siloxane polymers, polyvinylchloride, polyvinylbenzylchloride, polychlorostyrene, polyvinylbutyral, copolymers thereof, and mixtures thereof.

4. The process of claim 2, wherein said conducting polymer is seleceted from the group consisting of cis and trans polyacetylenes, polydiacetylenes, polyparaphenylenes, polypyrroles, polythiophenes, polybithiophenes, polyisothiophenes, polyphenylenevinylenes, polythienylvinlenes, polyphenylenesulfide, and polyaniline.

5. The process of claim 2, wherein said conducting polymer is polypyrrole.

6. The process of claim 5, wherein said agent is selected from the group consisting of ion milling, plasma etching, hypochlorite salts, and cerium (IV).

7. The process of claim 5, wherein said agent is a hypochlorite salt.

8. The process of claim 5, wherein said forming a surface of a blocking material on said surface of said conducting polymer in a pattern-wise fashion, to obtain a first patterned surface containing regions of exposed conducting polymer and regions of blocking material, comprises:
   ($b_1$) forming a surface of a resist on said surface of said conducting polymer;
   ($b_2$) exposing said surface of said resist to actinic radiation in a pattern-wise fashion to obtain a patterned surface containing regions of resist which have been exposed to said actinic radiation and regions of resist which have not been exposed to said actinic radiation; and
   ($b_3$) developing said patterned surface obtained in step ($b_2$) to obtain a patterned surface containing regions of exposed conducting polymer and regions of remaining resist.

9. The process of claim 2, wherein said conducting polymer is polyaniline.

10. The process of claim 9, wherein said agent is selected from the group consisting of ion milling, plasma etching, hypochlorite salts, and cerium (IV) salts.

11. The process of claim 9, wherein said agent is a hypochlorite salt.

12. The process of claim 9, wherein said forming a surface of a blocking material on said surface of said conducting polymer in a pattern-wise fashion, to obtain a first patterned surface containing regions of exposed conducting polymer and regions of blocking material, comprises:
   ($b_1$) forming a surface of a resist on said surface of said conducting polymer;
   ($b_2$) exposing said surface of said resist to actinic radiation in a pattern-wise fashion to obtain a patterned surface containing regions of resist which have been exposed to said actinic radiation and regions of resist which have not been exposed to said actinic radiation; and
   ($b_3$) developing said patterned surface obtained in step ($b_2$) to obtain a patterned surface containing regions of exposed conducting polymer and regions of remaining resist.

13. The process of claim 1, wherein said first patterned surface is treated with an agent which decreases the conductivity of said conducting polymer in said regions of exposed conducting polymer.

14. The process of claim 13, wherein said substrate is selected from the group consisting of glass, quartz, silica, silicon, silicon nitride, alumina, aluminum nitride, titania, titanium nitride, diamond, waxes, polyesters, polyvinylacetate, polyolefins, polyethers, polyvinylmethylether, polyvinylbutylether, polyamides, polyacrylamide, polyimides, polycarbonates, polysulfones, polyketones, fluoropolymers, aromatic hydrocarbon polymers, acrylate and acrylic acid polymers, phenolic polymers, polyvinylalcohol, polyamines, polypeptides, siloxane polymers, polyvinylchloride, polyvinylbenzylchloride, polychlorostyrene, polyvinylbutyral, copolymers thereof, and mixtures thereof.

15. The process of claim 13, wherein said conducting polymer is selected from the group consisting of cis and trans polyacetylenes, polydiacetylenes, polyparaphenylenes, polypyrroles, polythiophenes, polybithiophenes, polyisothiophenes, polyphenylenevinylenes, polythienylvinlenes, polyphenylenesulfide, and polyaniline.

16. The process of claim 13, wherein said conducting polymer is polypyrrole.

17. The process of claim 16, wherein said agent is selected from the group consisting of aqueous $R_{4-x}NH_x{}^+OH^-$ (where R is $C_{1-4}$-alkyl) and aerial oxidation.

18. The process of claim 14, wherein said agent is a aqueous $R_{4-x}NH_x{}^+OH^-$ (where R is $C_{1-4}$-alkyl).

19. The process of claim 14, wherein said forming a surface of a blocking material on said surface of said conducting polymer in a pattern-wise fashion, to obtain a first patterned surface containing regions of exposed conducting polymer and regions of blocking material, comprises:

($b_1$) forming a surface of a resist on said surface of said conducting polymer;

($b_2$) exposing said surface of said resist to actinic radiation in a pattern-wise fashion to obtain a patterned surface containing regions of resist which have been exposed to said actinic radiation and regions of resist which have not been exposed to said actinic radiation; and ($b_3$) developing said patterned surface obtained in step ($b_2$) to obtain a patterned surface containing regions of exposed conducting polymer and regions of remaining resist.

20. The process of claim 13, wherein said conducting polymer is polyaniline.

21. The process of claim 20, wherein said agent is selected from the group consisting of aqueous $R_{4-x}NH_x{}^+OH^-$ (where R is $C_{1-4}$-alkyl) and aerial oxidation.

22. The process of claim 20, wherein said agent is aqueous $R_{4-x}NH_x{}^+OH^-$ (where R is $C_{1-4}$-alkyl).

23. The process of claim 20, wherein said forming a surface of a blocking material on said surface of said conducting polymer in a pattern-wise fashion, to obtain a first patterned surface containing regions of exposed conducting polymer and regions of blocking material, comprises:

($b_1$) forming a surface of a resist on said surface of said conducting polymer;

($b_2$) exposing said surface of said resist to actinic radiation in a pattern-wise fashion to obtain a patterned surface containing regions of resist which have been exposed to said actinic radiation and regions of resist which have not been exposed to said actinic radiation; and ($b_3$) developing said patterned surface obtained in step ($b_2$) to obtain a patterned surface containing regions of exposed conducting polymer and regions of remaining resist.

* * * * *